United States Patent
Kathrein et al.

(10) Patent No.: US 6,726,987 B2
(45) Date of Patent: Apr. 27, 2004

(54) HARD METAL WEARING PART WITH MIXED OXIDE COATING

(75) Inventors: Martin Kathrein, Reutte (AT);
Wilfried Schintlmeister, Reutte (AT);
Wolfgang Wallgram, Breitenwang (AT)

(73) Assignee: Plansee Tizit Aktiengesellschaft, Reutte/Tirol (DE)

( * ) Notice: Subject to any disclaimer, the term of this patent is extended or adjusted under 35 U.S.C. 154(b) by 0 days.

(21) Appl. No.: 10/068,179

(22) Filed: Feb. 5, 2002

(65) Prior Publication Data

US 2003/0124363 A1 Jul. 3, 2003

(30) Foreign Application Priority Data

Feb. 9, 2001 (AT) .......................................... 102/01 U

(51) Int. Cl.⁷ ................................................ B32B 9/00
(52) U.S. Cl. ..................... 428/336; 428/472; 428/216; 428/697; 428/698; 428/701; 428/702
(58) Field of Search ................. 428/698, 701, 428/692, 699, 702, 704, 336, 472

(56) References Cited

U.S. PATENT DOCUMENTS

| 4,052,530 A | 10/1977 | Fonzi |
| 4,112,148 A | 9/1978 | Fonzi |
| 4,284,687 A | 8/1981 | Dreyer et al. |
| 4,599,281 A | 7/1986 | Schintlmeister et al. |
| 4,619,866 A | 10/1986 | Smith et al. |
| 4,714,660 A | * 12/1987 | Gates, Jr. |
| 4,746,563 A | 5/1988 | Nakano et al. |
| 5,071,696 A | * 12/1991 | Chatfield et al. |
| 5,674,564 A | * 10/1997 | Ljungberg et al. |
| 6,210,726 B1 | * 4/2001 | Dchiller et al. |

FOREIGN PATENT DOCUMENTS

| DE | 27 18 647 | 2/1978 |
| DE | 28 51 584 A1 | 6/1980 |
| EP | 0 045 291 B1 | 2/1982 |
| EP | 0 083 043 B1 | 7/1983 |
| EP | 0 162 656 B1 | 11/1985 |
| EP | 0 302 984 A1 | 2/1989 |
| EP | 0 492 059 A2 | 7/1992 |
| WO | 99/29921 | 6/1999 |
| WO | 00/17416 | 3/2000 |

* cited by examiner

Primary Examiner—Archene Turner
(74) Attorney, Agent, or Firm—Laurence A. Greenberg; Werner H. Stemer; Gregory L. Mayback

(57) ABSTRACT

The wearing part, such as a cutting insert, is made from hard metal or cermet. A hard-material coating is applied on the base material. The coating includes a single-layer or multi-layer mixed-oxide coat, predominantly comprising $Al_2O_3$, in which defined proportions of titanium oxide and boron oxide are dissolved or homogeneously distributed extremely finely. The wearing part is distinguished by a high wear resistance, which improves the service life, and a fine-grained structure and uniformity of the coat and by a highly economic application of the coat.

20 Claims, 4 Drawing Sheets

Fig. 1A - Sample 1
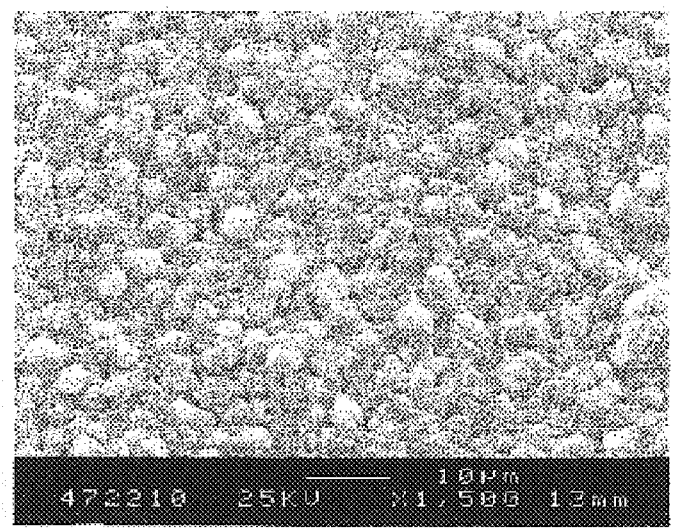
Fig. 1B - Sample 2
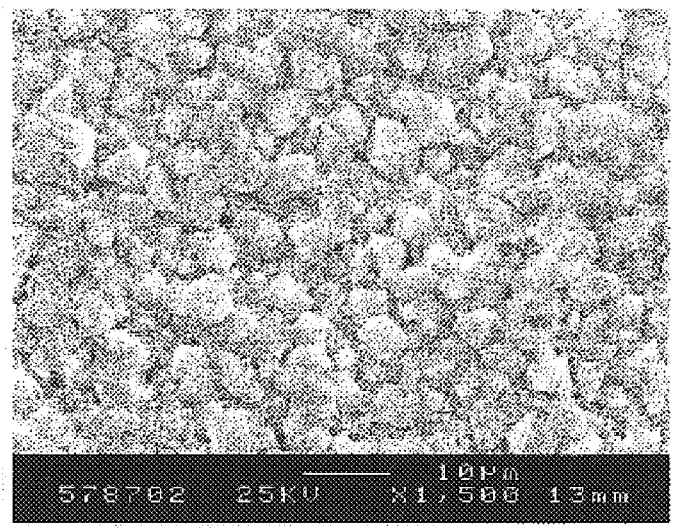
Fig. 1C - Sample 3

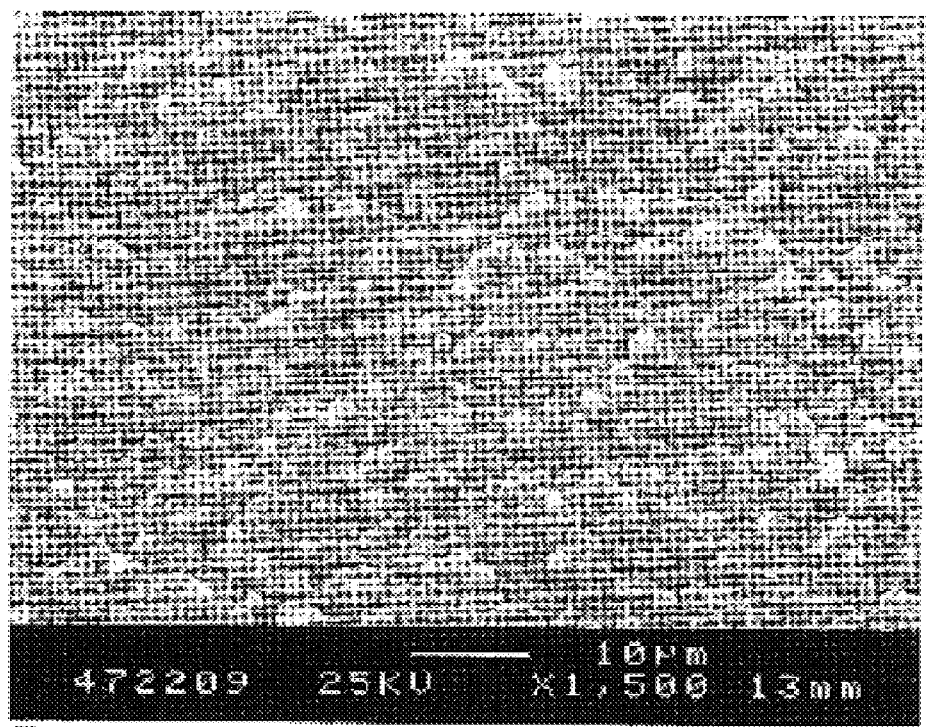
Fig. 2A - Sample 4
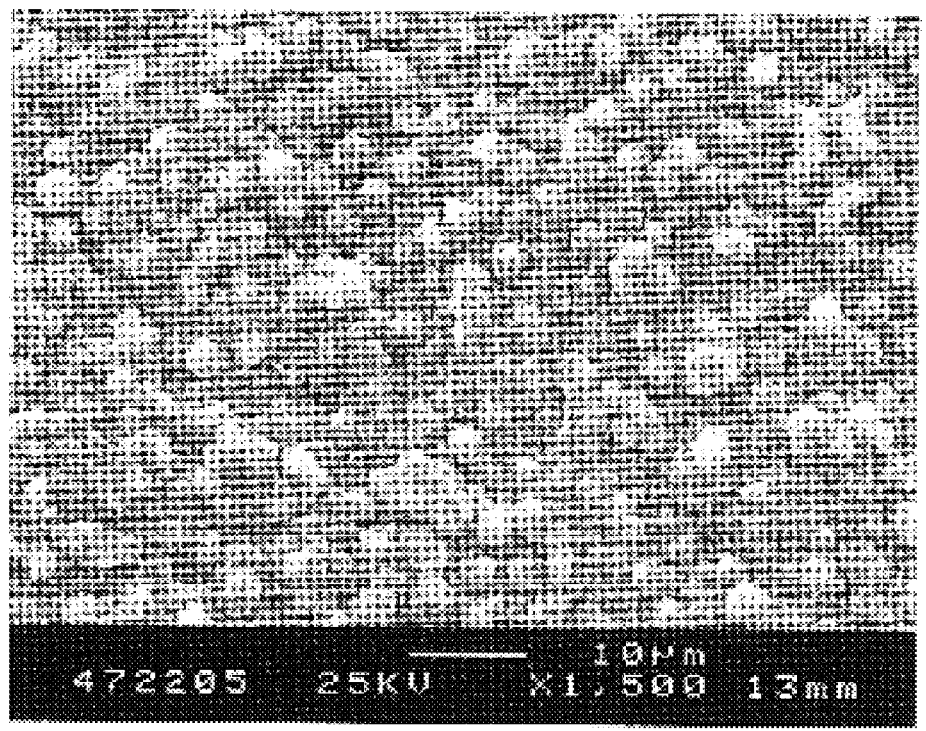
Fig. 2B - Sample 5

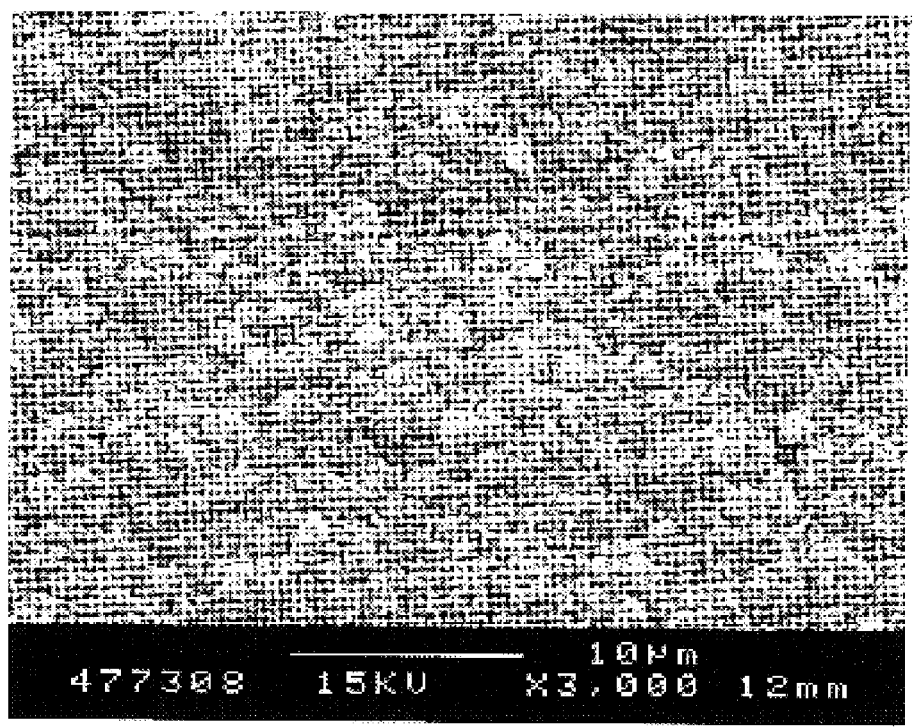
Fig. 5A - Sample 6
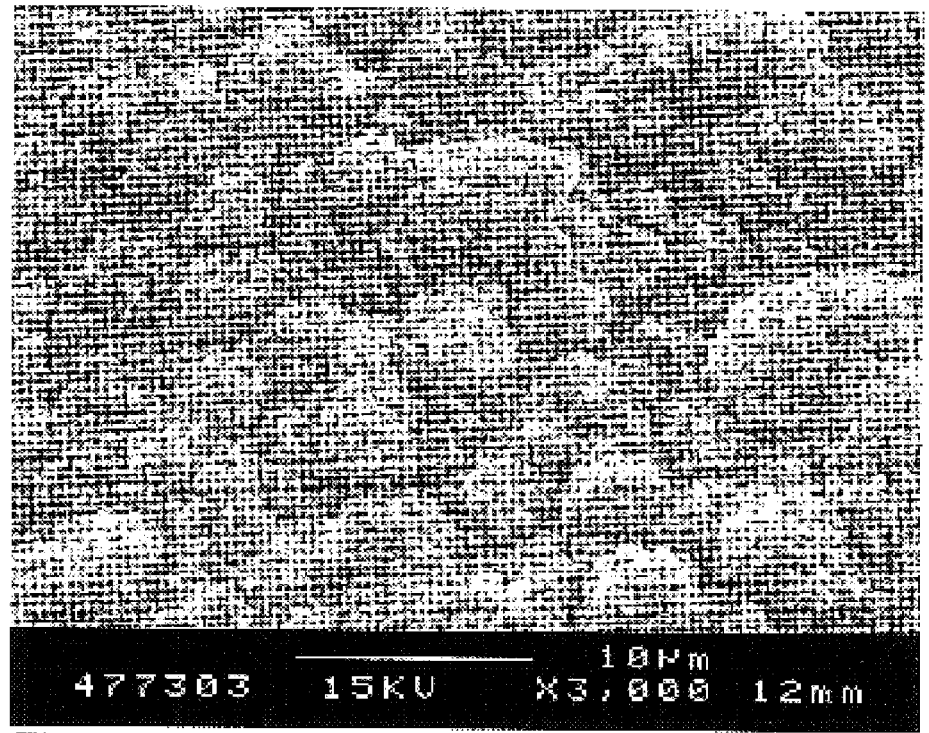
Fig. 5B - Sample 7

HARD METAL WEARING PART WITH MIXED OXIDE COATING

BACKGROUND OF THE INVENTION

Field of the Invention

The invention lies in the field of materials, and relates, more specifically, to a wearing part, in particular a cutting insert, made from hard metal or cermet as the base material. The part has a hard-material coating which comprises one or more coats, a single-layer or lamellar multilayer mixed-oxide coat. The latter substantially determines the wear and comprises predominantly aluminum oxide.

The effect of hard-material coats on hard metal and on cermets of increasing the resistance to wear has been utilized at a commercial level for many years. Among the many hard-material phases which have by now been used to protect against wear, hard materials selected from the group consisting of the carbides and carbonitrides and nitrides, and also hard materials selected from the group consisting of the oxides, have proven particularly successful and are nowadays often used together, as protective layers which complement one another, in a layered coat sequence.

It is thereby customary for coats belonging to one hard-material group to be designed in lamellar form, as a plurality of individual layers alternately comprising different hard materials, in order to satisfy the various demands imposed on a wearing part, in particular also on a cutting insert for the machining of metallic workpieces, with regard to adhesion, toughness, and low wear.

There are a number of known difficulties which arise when producing usable aluminum oxide coats on hard metal cutting inserts. The coat becomes considerably more brittle as its thickness increases and as the coat deposition rate increases, on account of coat grain coarsening. The high coating temperatures which are required in order to achieve the desired aluminum oxide phase (proportion of α and/or κ $Al_2O_3$) and coat structure conceal the risk of permanent quality losses for the base material; moreover, they lead to increased thermal stresses in the coat.

The permanent demand for oxide coats with a wear resistance that is improved compared to that of pure $Al_2O_3$, in particular for cutting inserts, has in the past been satisfied in various ways.

For example, U.S. Pat. No. 4,052,530 (see German application DE A 27 18 647) describes the application of a mixed coating comprising $Al_2O_3$ and $TiO_2$ phases on tools for material-removing machining. In accordance with the embodiment described in more detail in that document, the titanium oxide concentration in the coating is 2–10%, and this component is in the form of its own second phase in the aluminum oxide, as dispersed, hexagonal α-titanium oxide. The increases in service life which can be achieved for cutting tools coated in this manner compared to pure $Al_2O_3$ no longer match the standard wear resistance for cutting inserts which can nowadays be achieved in other ways.

U.S. Pat. No. 4,746,563 (see European patent EP 0 162 656) describes hard metals that are provided with a multi-layer coating, divided into undercoat and top coat. It is possible for each of the two coats in turn to be divided into a plurality of layers of different hard-material composition. The multilayer outer coat, with an overall layer thickness of 3 to 20 μm, comprises a plurality of $Al_2O_3$ layers each with a thickness of from 0.01 to 2 μm, it being possible for the $Al_2O_3$ phase to contain up to 30% by volume of titanium dioxide, the individual $Al_2O_3$ layers of the outer coat being interrupted or detached by interlayers of Ti(C, N, O, B) and SiC, AlN and AlON which are from 0.1 to 2 μm thick. According to the exemplary embodiment, the $Al_2O_3$ CVD coating takes place at a furnace temperature of 1000° C.

In view of the coat thicknesses, which are given as 3 to 20 μm, these coat sequences and deposition conditions indicate long coating times and therefore a time-consuming, expensive coating process. Moreover, the long coating times lead to losses of quality in the sintered carbide base material.

U.S. Pat. No. 4,599,281 (see European patent EP 0 083 043), as a further example of the development of $Al_2O_3$ coats, relates to a wearing part, in particular a hard metal cutting insert for material-removing machining, having a multicoat hard-material coating, at least one coat comprising oxides, nitrides, carbides and/or borides using individual metals such as titanium, zirconium and hafnium which are applied alternately with at least one aluminum/boron mixed oxide coat with boron contents of from 0.01 to 1% by weight.

Wearing parts which have been coated in this manner are now in commercial use in practice. Nevertheless, there is a need for a further increase in wear resistance or service life and for production costs for coated cutting inserts to be reduced. The cutting edge stability or resistance to flaking of the cutting edges is very important for reliable, nondestructive machining of workpieces and, compared to this prior art, is considered to be urgently in need of improvement.

SUMMARY OF THE INVENTION

It is accordingly an object of the invention to provide a wearing part of hard metal with a mixed oxide coating, which overcomes the above-mentioned disadvantages of the heretofore-known devices and methods of this general type and which satisfies the ongoing demand for improved wear resistance and cutting edge stability for wearing parts, in particular for cutting inserts for material-removing machining, while further reducing production costs.

With the foregoing and other objects in view there is provided, in accordance with the invention, a wearing part, comprising:
- a base material selected from the group consisting of hard metal and cermet;
- a hard-material coating on said base material, said coating having at least one mixed-oxide layer predominantly formed of $Al_2O_3$ and substantially determining a wear of said hard-material coating, said mixed-oxide layer having a thickness of 0.5 to 10 μm containing an addition of from 0.1 to <3% by weight of $TiO_2$ and 0.01 to 0.5% by weight of $B_2O_3$, and said addition is substantially dissolved and homogeneously distributed in the $Al_2O_3$ phase.

In other words, a wearing part of the generic type specified in the introduction is further improved with the single-layer or multilayer $Al_2O_3$ mixed oxide coat that is 0.5 to 10 μm thick and contains, substantially dissolved and homogeneously distributed in the $Al_2O_3$ phase, an addition of 0.1 to $\leq 3\%$ by weight of $TiO_2$ and 0.01 to 0.5% by weight of $B_2O_3$.

The proportions by weight of titanium oxide and boron oxide in the $Al_2O_3$ mixed-oxide coat are based on the compounds $TiO_2$ and $B_2O_3$. Therefore, there is no specific statement made as to the compound which is actually present.

The $Al_2O_3$ in the mixed-oxide coat may comprise one or more $Al_2O_3$ modifications, for example α $Al_2O_3$, κ $Al_2O_3$ or others.

The definition of the maximum additions of titanium oxide and boron oxide which can be introduced into the $Al_2O_3$ phase and the production parameters to be applied are to be adapted to one another, using rules which are known to the person skilled in the art, in such a way that the additions are actually completely dissolved in the $Al_2O_3$ or are to some extent homogeneously distributed in the $Al_2O_3$ so finely that they cannot be detected under light microscopy as an independent titanium oxide or boron oxide phase in addition to the $Al_2O_3$ phase.

The term "substantially" which is used for the additions within the feature "substantially dissolved and homogeneously distributed" therefore defines an $Al_2O_3$ mixed oxide phase within which a Ti oxide or B oxide phase cannot be detected under light microscopy, irrespective of what proportion of the addition actually satisfies the conditions of a solid solution.

A wearing part with an $Al_2O_3$ top coat formed in this manner is distinguished by relatively short production times and therefore lower production costs.

At the same time, the $Al_2O_3$ mixed oxide coat which has been modified in accordance with the invention leads to an unexpected increase in the resistance to wear, as is plausibly demonstrated below with reference to exemplary embodiments.

With coat deposition conditions which are otherwise directly comparable, with the $Al_2O_3$ mixed oxide coat according to the invention it is possible to achieve a much higher deposition rate than for $Al_2O_3$ mixed oxide coats according to the prior art. However, higher deposition rates mean a reduction in the coating time or a reduction in the coating temperature for forming a coat of defined thickness.

Higher deposition rates are however only technically appropriate if, and only to such an extent that, the grain size of a coat does not increase unacceptably as a result, since it is known that fine-grained layers tend to have a higher resistance to wear and improved toughness than coarse-grained layers.

Surprisingly, the deposition of the $Al_2O_3$ mixed oxide layers which have been modified in accordance with the invention leads to an increase in the deposition rate to an extent of up to a factor of three, without the increase in the grain size which would usually be expected by those of skill in the pertinent art.

The general rule is that the deposition rate when using CVD, PACVD (plasma activated chemical vapor deposition) and PVD coating, tends to increase as the temperature in the reaction chamber or at the surface of the wearing part increases.

The use of the above-described, surprisingly high deposition rates for the $Al_2O_3$ mixed oxide coats in accordance with the present invention makes it possible to reduce the reaction temperature in the coating chamber, for example, in the case of thermal CVD coating, from 1050° C. to 990° C. and below yet nevertheless to achieve a deposition rate which, although lower, remains sufficiently high with regard to achieving an acceptably short process duration as before. The reduction in each of the two parameters, both the deposition rate and the temperature in the coating chamber, however, leads to the grains in the deposited coat becoming finer to a relatively significant extent, and therefore to a highly advantageous increase in the resistance to wear with an increased cutting edge stability. Deposition at lower temperature reduces the load on the cutting material and, in addition, reduces thermal stresses in the coat.

Therefore, when advantageous use is made of the conditions described above, for the wearing part according to the invention it is possible to achieve both a significant increase in wear resistance, toughness and edge stability, on account of finer coat grain size or on account of the procedure taking place at lower temperatures, and to significantly improve the economics on account of shorter coating times.

Other features which are considered as characteristic for the invention are set forth in the appended claims.

Although the invention is illustrated and described herein as embodied in a hard metal wearing part with mixed oxide coating, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments and examples when read in connection with the accompanying drawings.

BRIEF DESCRIPTION OF THE DRAWINGS

FIG. 1A is a micrograph of a modified $Al_2O_3$ mixed oxide layer according to the invention;

FIGS. 1B and 1C are micrographs of an $Al_2O_3$ mixed oxide layer according to the prior art;

FIG. 2A is a micrograph of a layer according to the invention;

FIG. 2B is a micrograph of an $Al_2O_3$—$TiO_2$ mixed oxide layer;

FIG. 5A is a micrograph of a four-layer mixed oxide layer according to the invention; and FIG. 5B is a micrograph of a four-layer $Al_2O_3$-boron mixed oxide layer according to the prior art.

DESCRIPTION OF THE PREFERRED EMBODIMENTS

Figure 3:
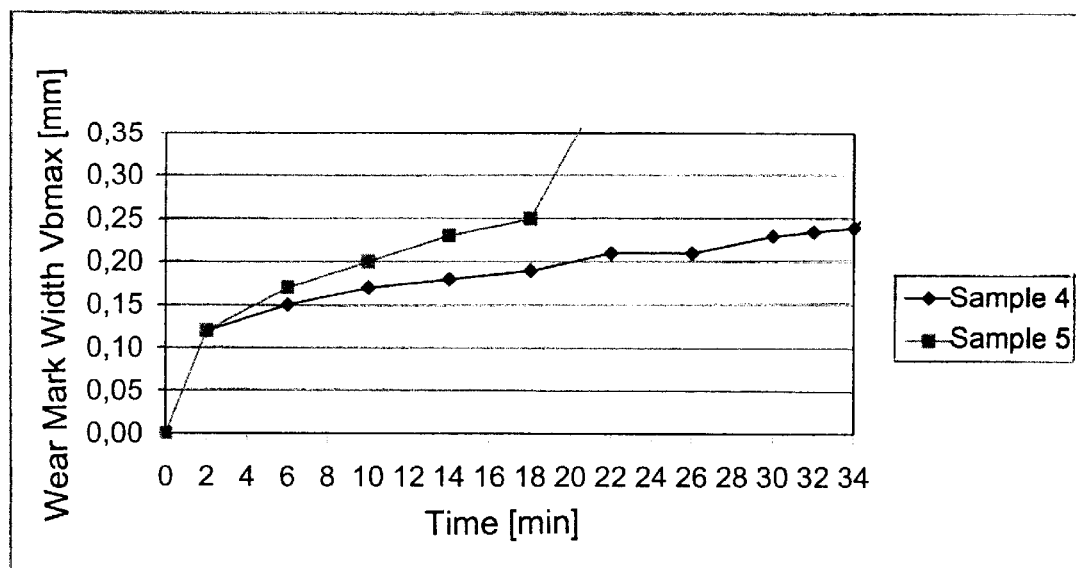
FIG. 3 is a graph plotting a wear behavior over time of the materials of FIGS. 2A and 2B.

A preferred embodiment of the wearing part according to the invention has a single-layer or multilayer undercoat of carbides, nitrides and/or borides, in particular including carbonitrides, between base material and single-layer or multilayer mixed oxide coat.

The dividing of an $Al_2O_3$ coat into individual thin layers in at each case alternating with Ti(C, N, B, O) or (TiAl) (C, N, B, O) interlayers has already been described in the prior art. However, in this case the interlayers do not have to contain all the elements C, N, B and O at the same time. According to a preferred configuration of the wearing part according to the present invention, the interlayers include, in addition to titanium, the elements carbon and nitrogen or boron and nitrogen as mandatory constituents and the remaining elements as optional constituents.

According to a further preferred embodiment of the invention, a titanium/boron nitride coating, which is 0.5–2 $\mu$m thick, if appropriate even less than 0.5 $\mu$m thick, is arranged between the single-layer or multilayer undercoat comprising carbides, nitrides and/or borides and the single-layer or multilayer mixed oxide coat. According to a preferred embodiment of the invention, the wearing part includes a further single-layer or multilayer coat comprising one or more hard materials of the composition metal (C, N, B), which is from 0.5 to 3 $\mu$m thick, on the outside following the mixed oxide coat. If appropriate, the coat may contain small proportions of oxygen or an oxide phase.

According to a preferred embodiment, on the wearing part a further single-layer or multilayer mixed oxide coat follows the above-mentioned further hard-material coat.

The base materials of the wearing part according to the invention are hard metals or cermets. The term hard metal is to be understood as meaning a sintered composite of carbide hard material particles and a binder material, e.g. cobalt and/or nickel. The term cermet is to be understood as meaning a group of sintered composite materials comprising carbide/nitride hard materials as the main constituent of the hard material phases and one or more metals selected from the iron group, predominantly comprising nickel, as binder material.

Various known coating processes have been adapted in experiments for the application of hard-material coats to hard metal and cermets, and have proven suitable for the production of wearing parts in accordance with the present invention. The CVD process (chemical vapor deposition process) is preferably applied to the present invention using standard pressure or subatmospheric pressure conditions, with sub-variants such as the plasma CVD process.

A prior art CVD process for achieving relatively high deposition rates is the addition of $H_2S$ to the reaction gas, as is described, for example, in U.S. Pat. No. 4,619,866 and European patent EP 0 045 291.

By way of example, for the deposition of $Al_2O_3$ at 1030° C., Example 6 of that document mentions a rate of 0.33 $\mu$m/h when $H_2S$ is added 0.17 $\mu$m/h in atmospheres without any $H_2S$.

This discovery can also be exploited in the present invention, either to further shorten the coating time or to further reduce the coating temperature to, for example, 930° C. or below.

As an alternative to the CVD processes with a gas atmosphere using standard or subatmospheric pressure, it is also possible to use various PVD (physical vapor deposition) processes for implementing the present invention, for example magnetron sputtering of metallic coat components from a sputtering target in a vapor phase which contains boron and oxygen.

When using PACVD (plasma activated physical vapor deposition) and PVD processes, the mixed oxide coat according to the invention can advantageously be applied directly to the base material. There is no need for the initial deposition of a single-layer or multilayer undercoat comprising carbides, nitrides and/or borides. Furthermore, the deposition of firstly a (Ti, Al)N coat on the base material, followed by the mixed oxide coat according to the invention, has also proven suitable in conjunction with PACVD and PVD processes. Furthermore, (Ti, Al) (N, B, C, O)-containing interlayers, for example (Ti, Al)N may be advantageous.

The present invention is described on the basis of the following exemplary embodiments, including associated layer microstructure images and graphs relating to machining tests.

EXAMPLE 1

A wearing part with a modified $Al_2O_3$ mixed oxide coat according to the invention is compared with wearing parts according to the prior art as described in the introductory text, i.e. with differently modified $Al_2O_3$ mixed oxide coats.

For this purpose, commercially available hard metal cutting inserts with a composition of WC, 8% by weight of mixed carbide, 6% by weight of Co and of type CNMG 120408 were initially in each case coated with an undercoat and then Sample 1 with a modified $Al_2O_3$ mixed oxide coat according to the invention.

Sample 2 with an $Al_2O_3$ mixed oxide coat in accordance with U.S. Pat. No. 4,746,563 and EP 0 162 656 ($Al_2O_3$ plus $TiO_2$, dissolved).

Sample 3 with an $Al_2O_3$ mixed oxide coat in accordance with U.S. Pat. No. 4,599,281 and EP 0 083 043 ($Al_2O_3$ plus boron oxide).

The samples for this comparative test were coated in a CVD coating installation which is suitable for mass production under standard pressure at a coating temperature of 990° C., with a similar composition of the coating atmosphere (identical, apart from the gas components containing titanium and boron) and in each case at the same location in the furnace chamber.

Following the base material, all the samples firstly received a two-layer undercoat, in each case comprising a carbon-rich carbonitride coat with a thickness of approximately 4.5 $\mu$m, followed by a carbonitride coat with a higher nitrogen content and a thickness of approx. 3 $\mu$m.

The mixed oxide coating in the form of a modified aluminum oxide coat was in single-layer form for each sample and for the samples with a boron oxide content had a uniform thickness of approximately 2.6 $\mu$m, while for the mixed oxide coat without a boron oxide content (Sample 2) had a fluctuating, uneven thickness of between 1.5 and 4 $\mu$m.

The following deposition rates were determined:

Sample 1 0.8 $\mu$m per hour

Sample 2 0.4 to 1.1 $\mu$m per hour, locally greatly fluctuating

Sample 3 0.44 $\mu$m per hour.

Therefore, the coating deposition rate for Sample 1 according to the invention is approximately twice as high as for the comparative samples according to the prior art.

In detail, in addition to areas of low deposition rate, Sample 2 also has high deposition rates in other areas, which leads to a highly disadvantageous uneven sample surface.

The surface images (FIGS. 1A to c) determined for Samples 1 to 3 in this order show, with an identical degree of enlargement in a SEM (scanning electron microscope) image, the different structure, grain size and grain size distribution of the respective coats.

The advantageous characteristics in terms of a relatively small grain diameter and uniform grain size distribution for Sample 1 according to the present invention are obvious.

For comparison purposes, Samples 1 to 3 were subjected to a qualitative machining test. This test revealed the superior wear resistance of Sample 1, the cutting insert according to the invention, compared to the samples produced in accordance with the prior art.

For a quantitative wear test, reference is made to the following Examples 2 and 3, in which the respective mixed oxide coats were made in the form of a multilayer coat in accordance with current standard practice.

EXAMPLE 2

The condition of Samples 4 and 5 corresponds to Example 1 with regard to base material and type or geometry of the hard metal cutting insert, and in addition hard metal cutting inserts of type CNMA 120408 were coated, and also with regard to the coating parameters for undercoats and mixed oxide coats.

Sample 4 in accordance with the present invention

Sample 5 with $Al_2O_3/TiO_2$ mixed oxide coat

The following deposition rates were achieved:

Sample 4 1.0 μm per hour

Sample 5 0.6 to 0.9 μm per hour

The coating in each case comprises a two-layer undercoat (TiCN) with a thickness of approx. 7.5 μm, followed by a three-layer mixed oxide coat, each layer being interrupted by a Ti(C, N, O) interlayer with a thickness of 0.5 μm. The total thickness of the mixed oxide coat (mixed oxide layers and Ti(C, N, O) layers) is approximately 4.1 μm.

FIGS. 2A and 2B show the surface images associated with Samples 4 and 5, in the form of SEM images.

Sample 4, produced according to the invention, has a considerably more homogeneous and fine-grained microstructure than comparative Sample 5 in accordance with the prior art.

To determine the resistance to wear, the cutting inserts which have been produced in this manner were exposed to a wear test in two different machining experiments. The end of service life was set to be reached at a wear mark width of 0.3 mm:

In the first comparative test, Samples 4 and 5 were used for the dry turning of a shaft made from the material Ck 67, using the following cutting parameters $V_c$ (cutting rate)=180 m/min f (feed)=0.21 mm/rev $a_p$ (cutting depth)=2.0 mm.

FIG. 3 shows a graph illustrating the wear mark width measured in each case in dependence on the turning time. While Sample 5 failed for wear reasons after approximately 18 min, the test carried out on Sample 4 was interrupted after 34 minutes without the end of the service life having been reached.

In a second comparative test, Samples 4 and 5 were used for segment turning of a GG 25 material—dry—with the following cutting parameters $V_C$=250 m/min f=0.3 mm/rev.

Figure 4:
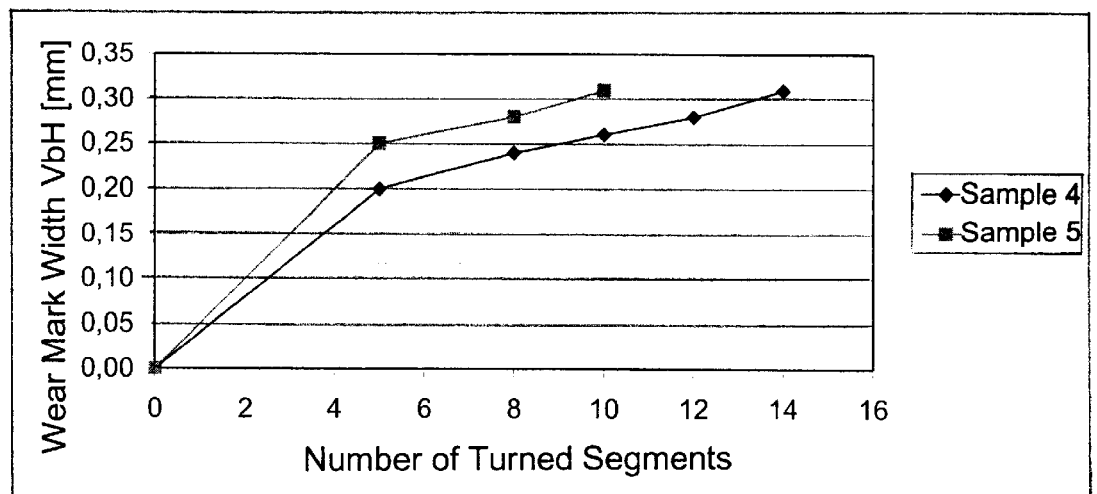
FIG. 4 is a graph plotting a wear behavior over a number of segments for the materials of FIGS. 2A and 2B.

FIG. 4 shows a graph illustrating the wear mark width determined as a function of the number of turned segments for Sample 4 and 5, as a comparison.

The cutting insert using Sample 4 according to the invention has a notable improvement in the resistance to wear compared to Sample 5; specifically, Sample 5 was able to turn 10 segments, while Sample 4 was able to turn 14 segments, i.e. an improvement of 40%.

Sample 6 in accordance with the present invention, similar to Sample 4, but with a 4-layer mixed oxide coat.

Sample 7 $Al_2O_3$/boron mixed oxide coat, mixed oxide coat differing from Sample 6, in accordance with known prior art, likewise 4-layer mixed oxide coat in accordance with EP 0 083 043.

The following deposition rates were achieved in the comparison:

Sample 6 1.0 μm/hour

Sample 7 0.9 μm/hour (at 1040° C., compared to the furnace temperature which is otherwise 990° C.)

The associated microstructural images are shown in FIGS. 5A and 5B. The microstructural image belonging to Sample 6 reveals a very fine, homogeneous microstructure compared to the microstructural image for Sample 7.

The samples were used for the wet and dry machining of various materials, with in each case comparable cutting parameters, in turning tests.

The following Table 1 below summarizes the improvement in service life achieved in each case by Sample 6, i.e. the cutting insert according to the invention, compared to Sample 7, a cutting insert having the coating in accordance with the prior art cited in the introduction, even though the latter cutting inserts have hitherto been in widespread commercial use.

TABLE 1

| | | Parameter | | | Service life [min] | | Improvement |
| --- | --- | --- | --- | --- | --- | --- | --- |
| | | vc | | ap | | | |
| Material | Conditions | [m/min] | f [mm] | [mm] | Sample 6 | Sample 7 | in service life |
| Ck67 | dry | 180 | 0.21 | 2 | 20 | 14 | 43% |
| 100Cr6 | dry | 200 | 0.25 | 2 | 24 | 15 | 60% |
| 42CrMo4 | dry | 200 | 0.25 | 2 | 50 | 38 | over 30% |
| GG25 | dry | 300 | 0.30 | 2 | 15 | 9 | 67% |
| GG25 | wet | 400 | 0.30 | 2 | 15 | 9 | 67% |

We claim:

1. A wearing part, comprising:

a base material selected from the group consisting of hard metal and cermet;

a hard-material coating on said base material, said coating having at least one mixed-oxide layer predominantly formed of $Al_2O_3$ and substantially determining a wear of said hard-material coating, said mixed-oxide layer having a thickness of 0.5 to 10 μm, containing an addition of from 0.1 to ≦3% by weight of $TiO_2$ and 0.01 to 0.5% by weight of $B_2O_3$, and said addition being substantially dissolved and homogeneously distributed in the $Al_2O_3$ phase.

2. The wearing part according to claim 1, wherein said base material and said hard-material coating are configured as a cutting insert.

3. The wearing part according to claim 1, wherein said hard-material coating is a single-layer mixed-oxide coating.

4. The wearing part according to claim 1, wherein said hard-material coating is a multilayer coating including said mixed-oxide layer.

5. The wearing part according to claim 1, wherein said multilayer coating is a mixed-oxide coat with a lamellar multilayer structure.

6. The wearing part according to claim 5, wherein said layers of said lamellar multilayer structure are interrupted by interlayers comprising the elements Ti and one or more elements selected from the group consisting of C, N, B, O and (Ti, Al) and one or more elements selected from the group consisting of C, N, B, and O and having a thickness from 0.05 to 1 μm.

7. The wearing part according to claim 5, wherein said layers of said lamellar multilayer structure are interrupted by interlayers comprises of Ti and one or more elements selected from the group consisting of C, N, B, and O, having a thickness from 0.05 to 1 μm, and said interlayers between individual mixed-oxide layers of said mixed-oxide coat contain, in addition to titanium, a member of the group consisting of carbon and nitrogen, boron and nitrogen, as a mandatory constituent and the respectively other members of the group as optional constituents.

8. The wearing part according to claim 1, which comprises an undercoat of at least one material selected from the group consisting of carbides, nitrides, carbonitrides, and borides disposed between said base material and said mixed-oxide layer and having a thickness from 1 to 15 μm.

9. The wearing part according to claim 8, wherein said undercoat is a multilayer coat.

10. The wearing part according to claim 8, which comprises a Ti (N, B) coat disposed between said undercoat and said mixed-oxide layer and having a thickness from 0.2 to 2 μm.

11. The wearing part according to claim 1, which comprises a further layer formed on said hard-material coating, said further layer comprising one or more hard materials of Me(C, N, B), and an optional minor proportion of oxide, and having a thickness from 0.5 to 3 μm.

12. The wearing part according to claim 11, wherein said further layer is a single-layer coating.

13. The wearing part according to claim 11, wherein said further layer is a multilayer coating.

14. The wearing part according to claim 11, which further comprises an additional mixed-oxide layer applied to said further layer.

15. The wearing part according to claim 11, wherein said additional mixed-oxide layer is a single-layer coating.

16. The wearing part according to claim 11, wherein said additional mixed-oxide layer is a multilayer coating.

17. The wearing part according to claim 1, wherein individual or all layers of said hard-material coating are CVD coatings deposited under standard pressure.

18. A wearing part, comprising:
 a body of a base material selected from the group consisting of hard metal and cermet; and
 a hard-material coating on said body of base material, said hard-material coating including
  a multilayer mixed-oxide coat predominantly formed of $Al_2O_3$, having a thickness of 0.5 to 10 μm, and containing, substantially dissolved and homogeneously distributed in the $Al_2O_3$, phase, an addition of from 0.1 to $\leq 3\%$ by weight of $TiO_2$ and 0.01 to 0.5% by weight of $B_2O_3$; and
  interlayers of a material selected from the group consisting of Ti(C, N, B, O) and (Ti, Al) (C, N, B, O) formed between individual layers of said multilayer mixed-oxide coat and having a thickness of 0.05 to 1 μm.

19. The wearing part according to claim 18, which further comprises an undercoat formed of at least one material selected from the group consisting of carbides, nitrides, carbonitrides, and borides, having a thickness of between 1 and 15 μm, and disposed between said base material and said mixed-oxide coat.

20. The wearing part according to claim 18, wherein said body and said coating together form a cutting insert.

* * * * *

UNITED STATES PATENT AND TRADEMARK OFFICE
CERTIFICATE OF CORRECTION

PATENT NO.        : 6,726,987 B2
APPLICATION NO. : 10/068179
DATED             : April 27, 2004
INVENTOR(S)       : Martin Kathrein et al.

It is certified that error appears in the above-identified patent and that said Letters Patent is hereby corrected as shown below:

Item [73] should read as follows:

CERATIZIT Austria Gesellschaft m.b.H., Reutte/Tirol (DE)

Signed and Sealed this

Twenty-fourth Day of June, 2008

JON W. DUDAS
*Director of the United States Patent and Trademark Office*